United States Patent
Ware et al.

(10) Patent No.: US 12,550,341 B2
(45) Date of Patent: Feb. 10, 2026

(54) CAPACITORS FOR HIGH TEMPERATURE SYSTEMS, METHODS OF FORMING SAME, AND APPLICATIONS OF SAME

(71) Applicant: BOARD OF TRUSTEES OF THE UNIVERSITY OF ARKANSAS, Little Rock, AR (US)

(72) Inventors: Morgan Ware, Fayetteville, AR (US); Pijush Kanti Ghosh, Dallas, TX (US); Xiangbo Meng, Fayetteville, AR (US); Mirsaeid Sarollahi, Fayetteville, AR (US); Rohith Allaparthi, Fayetteville, AR (US)

(73) Assignee: BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 200 days.

(21) Appl. No.: 17/746,027

(22) Filed: May 17, 2022

(65) Prior Publication Data

US 2022/0376120 A1   Nov. 24, 2022

Related U.S. Application Data

(60) Provisional application No. 63/189,937, filed on May 18, 2021.

(51) Int. Cl.
*H10D 64/00* (2025.01)
*H10D 1/66* (2025.01)
(Continued)

(52) U.S. Cl.
CPC ............... *H10D 1/66* (2025.01); *H10D 8/051* (2025.01); *H10D 62/8325* (2025.01);
(Continued)

(58) Field of Classification Search
CPC ...... H01L 29/94; H01L 29/511; H01L 29/518; H01L 29/6606; H01L 21/02178;
(Continued)

(56) References Cited

U.S. PATENT DOCUMENTS

| 6,121,633 A * | 9/2000 | Singh ................. H01L 29/1608 |
| | | 257/E29.174 |
| 2008/0079023 A1* | 4/2008 | Hikita ................. H10D 30/015 |
| | | 257/E29.252 |

(Continued)

OTHER PUBLICATIONS

Khosa RY, Chen JT, Palsson K, Karhu R, Hassan J, Rorsman N, Sveinbjörnsson EÖ, Electrical properties of 4H—SiC MIS capacitors with AlN gate dielectric grown by MOCVD. Solid-State Electronics, 153:52-58. (2019).

(Continued)

*Primary Examiner* — Sheikh Maruf
(74) *Attorney, Agent, or Firm* — troutman pepper locke; Tim Tingkang Xia, Esq.

(57) ABSTRACT

A capacitor is provided for high temperature systems. The capacitor includes: a substrate formed from silicon carbide material; a dielectric stack layer, including a first layer deposited on the substrate and a second layer deposited on the first layer; a Schottky contact layer deposited on the second layer; and an Ohmic contact layer deposited on the substrate. The first layer is formed with aluminum nitride (AlN) epitaxially, and the second layer is formed with aluminum oxide ($Al_2O_3$). AlN and $Al_2O_3$ are ultrawide band gap materials, and as a result, they can be use as the dielectric in the capacitor, allowing the capacitance changes to be less than 10% between −250° C. and 600° C., which is very effective for the high temperature systems.

9 Claims, 11 Drawing Sheets

(51) Int. Cl.
*H10D 8/01* (2025.01)
*H10D 62/832* (2025.01)
*H10D 64/68* (2025.01)
*H01L 21/02* (2006.01)
*H10D 62/40* (2025.01)
*H10D 64/62* (2025.01)
*H10D 64/66* (2025.01)

(52) U.S. Cl.
CPC ......... *H10D 64/681* (2025.01); *H10D 64/693* (2025.01); *H01L 21/02178* (2013.01); *H01L 21/022* (2013.01); *H01L 21/02266* (2013.01); *H01L 21/0228* (2013.01); *H10D 62/40* (2025.01); *H10D 64/62* (2025.01); *H10D 64/665* (2025.01)

(58) Field of Classification Search
CPC ............ H01L 21/022; H01L 21/02266; H01L 21/0228; H01L 29/04; H01L 29/1608; H01L 29/45; H01L 29/495; H01L 21/02293; H01L 21/02304; C30B 25/02; C30B 29/403; H10D 1/66; H10D 8/051; H10D 62/8325; H10D 64/681; H10D 64/693; H10D 62/40; H10D 64/62; H10D 64/665
USPC .......................................................... 257/77
See application file for complete search history.

(56) References Cited

U.S. PATENT DOCUMENTS

| | | | | |
|---|---|---|---|---|
| 2011/0006346 A1* | 1/2011 | Ando | ................ | H01L 29/4236 257/192 |
| 2012/0139623 A1* | 6/2012 | Hashimoto | ............ | H01L 29/78 257/77 |
| 2012/0199846 A1* | 8/2012 | Shimizu | .............. | H01L 29/7395 257/77 |
| 2012/0211768 A1* | 8/2012 | Yoshikawa | ......... | H01L 29/0657 257/77 |
| 2012/0223320 A1* | 9/2012 | Dora | ................ | H01L 21/76804 257/E21.159 |
| 2013/0032821 A1* | 2/2013 | Lee | .................... | H01L 29/2003 438/479 |
| 2013/0240836 A1* | 9/2013 | Lee | ...................... | H01L 29/155 257/E21.403 |
| 2014/0264459 A1* | 9/2014 | Choi | ................ | H01L 21/02433 257/201 |
| 2015/0162424 A1* | 6/2015 | Briere | ................ | H10D 30/475 257/194 |
| 2015/0162447 A1* | 6/2015 | Lee | ..................... | H01L 29/7851 257/18 |
| 2015/0303271 A1* | 10/2015 | Tanaka | ................ | H01L 29/517 257/77 |
| 2015/0325660 A1* | 11/2015 | Hitora | .................... | H01L 29/22 257/43 |
| 2015/0357457 A1* | 12/2015 | Ritenour | .......... | H01L 21/28264 257/76 |
| 2016/0087044 A1* | 3/2016 | Iijima | ................ | H01L 29/1095 257/77 |
| 2016/0087086 A1* | 3/2016 | Cho | .................... | H10D 30/024 257/12 |
| 2016/0197146 A1* | 7/2016 | Augusto | ............. | H01L 29/0649 257/22 |
| 2016/0197150 A1* | 7/2016 | Ariyoshi | ............... | H01L 29/513 257/77 |
| 2016/0351564 A1* | 12/2016 | Azize | ...................... | H10D 8/60 |
| 2017/0018617 A1* | 1/2017 | Xia | .................... | H10D 30/6738 |
| 2017/0125569 A1* | 5/2017 | Ozaki | ................. | H10D 30/675 |
| 2017/0358670 A1* | 12/2017 | Kub | ................ | H10D 64/111 |
| 2018/0145148 A1* | 5/2018 | Yamada | ............... | H10D 62/824 |
| 2018/0197856 A1* | 7/2018 | Chou | .................... | H10D 84/01 |
| 2018/0240753 A1* | 8/2018 | LaRoche | ............... | H10D 62/85 |
| 2018/0240754 A1* | 8/2018 | LaRoche | ............. | H10D 30/475 |
| 2018/0358463 A1* | 12/2018 | Kobayashi | ........ | H01L 29/41766 |
| 2019/0051740 A1* | 2/2019 | Okamoto | ............ | H01L 23/5329 |
| 2019/0081170 A1* | 3/2019 | Kumagai | ............. | H01L 27/088 |
| 2019/0097001 A1* | 3/2019 | LaRoche | ............... | H10D 64/111 |
| 2019/0131302 A1* | 5/2019 | Yi | ............................ | H10D 30/69 |
| 2019/0181229 A1* | 6/2019 | Okumura | ............ | H10D 12/481 |
| 2019/0206998 A1* | 7/2019 | Huang | ............... | H10D 62/343 |
| 2020/0006522 A1* | 1/2020 | Yeh | .................... | H01L 21/76897 |
| 2020/0044067 A1* | 2/2020 | Banerjee | ............ | H10D 30/015 |
| 2020/0161447 A1* | 5/2020 | Chou | ................ | H01L 21/32133 |
| 2020/0176389 A1* | 6/2020 | Huang | ............... | H01L 23/53295 |
| 2020/0243641 A1* | 7/2020 | Nakagawa | ........... | H10D 64/518 |
| 2020/0373398 A1* | 11/2020 | Fiorenza | ............... | H10D 64/118 |
| 2020/0395475 A1* | 12/2020 | Bothe | ................ | H10D 62/8503 |
| 2020/0407213 A1* | 12/2020 | Kub | ................ | H01L 29/1608 |
| 2021/0111254 A1* | 4/2021 | Jones | .................. | H10D 30/475 |
| 2021/0119028 A1* | 4/2021 | Roizin | ................ | H10D 62/824 |
| 2021/0134994 A1* | 5/2021 | Chiang | ................ | H10D 64/62 |
| 2021/0399097 A1* | 12/2021 | Vellianitis | .......... | H10D 30/6755 |
| 2022/0052078 A1* | 2/2022 | Kim | ................... | H10D 86/441 |
| 2022/0085163 A1* | 3/2022 | Lin | .................... | H10D 62/8503 |
| 2022/0165757 A1* | 5/2022 | Kim | ................... | H10D 86/021 |
| 2022/0223694 A1* | 7/2022 | Kantarovsky | ........ | H10D 30/475 |
| 2022/0302258 A1* | 9/2022 | More | ................ | H10D 30/6757 |
| 2022/0320297 A1* | 10/2022 | Hwang | ................ | H10D 30/475 |
| 2022/0376082 A1* | 11/2022 | Zhang | ................ | H10D 62/8503 |
| 2023/0154986 A1* | 5/2023 | Okumura | ............ | H10D 30/665 257/77 |

OTHER PUBLICATIONS

Sergeeva ON, Bogomolov AA, Solnyshkin AV, Komarov NV, Kukushkin SA, Krasovitsky DM, Dudin AL, Kiselev DA, Ksenich SV, Senkevich SV, Kaptelov EY, Pronin IP, SEM, Dielectric, Pyroelectric, and Piezoelectric Response of Thin Epitaxial AlN Films Grown on SiC/Si Substrate. Ferroelectrics, 477(1):121-130. (2015).

* cited by examiner

CAPACITORS FOR HIGH TEMPERATURE SYSTEMS, METHODS OF FORMING SAME, AND APPLICATIONS OF SAME

CROSS-REFERENCE TO RELATED PATENT APPLICATION

This application claims priority to and the benefit of U.S. Provisional Patent Application Ser. No. 63/189,937, filed May 18, 2021, which is incorporated herein in its entirety by reference.

STATEMENT AS TO RIGHTS UNDER FEDERALLY-SPONSORED RESEARCH

This invention was made with government support under Grant No. EEC-1449548 awarded by the National Science Foundation Engineering Research Center for Power Optimization of Electro Thermal Systems (POETS). The government has certain rights in the invention.

FIELD OF THE INVENTION

The invention relates generally to capacitor technology, and particularly to capacitors for high temperature systems, methods of forming the same, and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions.

Wide-band gap (WBG) power electronics significantly increases the driving range and reduces the cost of electric vehicles, for example, through increasing the power conversion efficiency, switching frequencies and power density, as well as supporting high temperature operation of traction drive systems. Future generations of high power electronic converters rely on the flexibility and tolerance of components used to increase power density in order to supply a greater power in a smaller form. As a result of the increased power density, there is an associated increase in heat load which generally degrades the performance of most board level components. Recent studies on thermal management in power electronics pointed out that when WBG devices operate at 175° C. junction temperature, the temperature of DC link capacitors are predicted to exceed 85° C. This is generally the temperature limit for commonly used polypropylene (PP) film capacitors, resulting in a 50% voltage derating due to their drastically deteriorated breakdown strength and lifetime. Additionally, when the junction reaches 250° C., the capacitor case temperature can approach 140° C. and all existing film capacitors will simply fail. Traditional capacitor design, with conventional dielectrics cannot adequately meet all of the performance goals for capacitance density, weight, volume, and high temperature operation.

Therefore, a heretofore unaddressed need exists in the art to address the aforementioned deficiencies and inadequacies.

SUMMARY OF THE INVENTION

One of the objectives of the invention is to provide a capacitor using single crystal, epitaxial aluminum nitride (AlN)) grown on a silicon carbide (SiC) substrate, such as a 4H-SiC substrate, for high temperature electronic applications.

One aspect of the invention relates to a capacitor, which includes: a conductive substrate of silicon carbide (SiC); and a dielectric stack layer comprising a first layer deposited on the substrate, wherein the first layer is formed with aluminum nitride (AlN) epitaxially.

In certain embodiments, the capacitor further includes an Ohmic contact layer deposited on the substrate.

In certain embodiments, the Ohmic contact layer and the dielectric stack layer are deposited on a same side of the substrate.

In certain embodiments, the Ohmic contact layer and the dielectric stack layer are deposited respectively on two opposite sides of the substrate.

In certain embodiments, the dielectric stack layer further comprises a second layer deposited on the first layer, wherein the second layer comprises aluminum oxide ($Al_2O_3$) grown on the first layer.

In certain embodiments, the capacitor further includes a Schottky contact layer deposited on the second layer.

In certain embodiments, the Schottky contact layer and the Ohmic contact layer are both formed with nickel (Ni).

In certain embodiments, the SiC material of the substrate is 4H-SiC.

In certain embodiments, the capacitor has an operating temperature range between −250° C. and +600° C. In certain embodiments, the operating temperature range is between −188° C. and +327° C., and a capacitance change of the capacitor in the operating temperature range is less than 10%.

In certain embodiments, a thickness of the first layer is in a range of about 100-1500, and a thickness of the second layer is about in a range of about 10-250 nm.

In another aspect of the invention, a method of forming a capacitor is provided. The method in certain embodiments includes providing a substrate formed of conductive silicon carbide (SiC); and forming a dielectric stack layer on the substrate comprising depositing a first layer on the substrate, wherein the first layer is formed with aluminum nitride (AlN) epitaxially at a first temperature; and depositing an Ohmic contact layer on the substrate.

In certain embodiments, said forming the dielectric stack layer further comprises depositing a second layer on the first layer, wherein the second layer is formed with aluminum oxide ($Al_2O_3$) at a second temperature.

In certain embodiments, the method further comprises depositing a Schottky contact layer on the second layer.

In certain embodiments, the first temperature is anywhere in between in a range of about 700-1100° C., and the second temperature is in a range of about 50-150° C.

In certain embodiments, the Ohmic contact layer is formed by annealing a metal at a third temperature for a time period. In one embodiment, the metal is nickel, the third temperature is in a range of about 800-1200° C., and the time period is in a range of about 0.1-5 minutes.

In certain embodiments, the Ohmic contact layer and the dielectric stack layer are deposited on a same side of the substrate.

In certain embodiments, the Ohmic contact layer and the dielectric stack layer are deposited respectively on two opposite sides of the substrate.

In certain embodiments, the SiC material of the substrate is conductive 4H-SiC.

In certain embodiments, the capacitor has an operating temperature range between −250° C. and 600° C., and a capacitance change of the capacitor in the operating temperature range is less than 10%.

In certain embodiments, a thickness of the first layer is in a range of about 100-1500 nm, and a thickness of the second layer is in a range of about 10-250 nm.

In certain embodiment, the first layer is formed by molecular beam epitaxy (MBE), hydride vapor-phase epitaxial (HVPE), physical vapor transport (PVT), metal organic chemical vapor deposition (MOCVD), or a modification of them; and the second layer is formed by atomic layer deposition (ALD), sintering, or a modification of them.

A further aspect of the invention relates to an electronic device, which includes the capacitor as described above or the capacitor formed by the method as described above.

These and other aspects of the invention will become apparent from the following description of the preferred embodiments, taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

DETAILED DESCRIPTION OF THE INVENTION

Figure 1A:
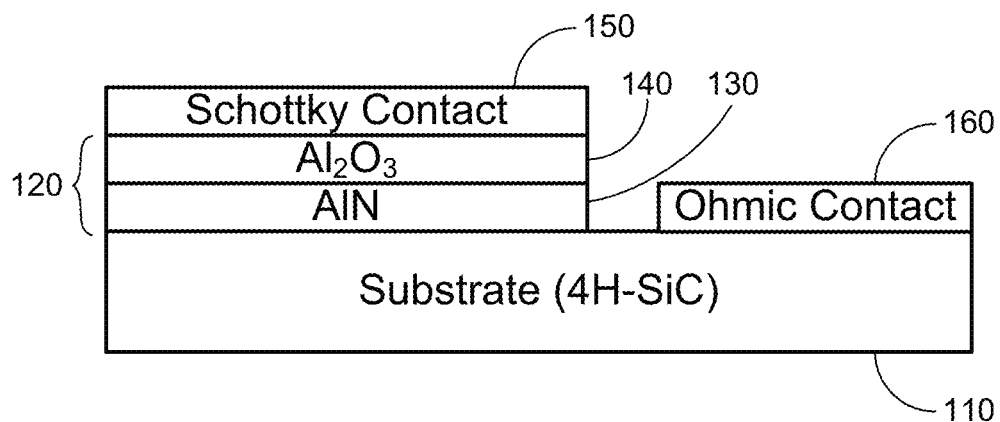
FIG. 1A shows schematically a capacitor according to one embodiment of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this invention, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

As used herein, the phrase at least one of A, B, and C should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

A capacitor is a component of an electric system which effectively stores electric charge temporarily. The capacitor is different from a battery, which can be considered to store charge permanently. Specifically, the capacitor has innumerable specific uses in electric circuits, but the focus of this invention here is on the broad field of power electronic subsystems where the capacitor is a key component in the conversion of current from alternating (AC) to direct (DC) and back again, which is a process used multiple times in converting power for use in electric vehicles for example, where space is extremely limited and temperatures can run very high.

As discussed above, when WBG devices operate at 175° C. junction temperature, the temperature of DC link capacitors are predicted to exceed 85° C., which is the temperature limit for commonly used polypropylene (PP) film capacitors; and when the junction reaches 250° C., the capacitor case temperature can approach 140° C., and all existing film capacitors will simply fail. To avoid such issue, the invention in one aspect discloses a capacitor using single crystal, epitaxial AlN and $Al_2O_3$ grown on a SiC substrate, such as a 4H-SiC substrate, for high temperature electronic applications.

AlN and $Al_2O_3$ are ultrawide band gap materials, and as a result, they can be used as the dielectric in the capacitors. The material properties of AlN and $Al_2O_3$ are stable over wide temperature ranges, e.g., from less than 0° C. to about 600° C. Most of the state-of-the-art high temperature capacitors lose 70% or more of their capacitance at high temperatures, which is very risky for the whole system. However, when AlN and $Al_2O_3$ are used, the capacitance changes less than 10% between −188° C. and 327° C., even between −270° C. and 600° C., which is very effective for the circuit as well as for the system.

In one aspect of the invention, the capacitor is formed by an $Al_2O_3$/AlN/4H-SiC material stack. For example, FIG. 1A shows schematically a capacitor according to one embodiment of the invention. As shown in FIG. 1A, the capacitor 100 includes a substrate 110, a dielectric stack layer 120, a Schottky contact layer 150, and an Ohmic contact layer 160. Specifically, the substrate 110 is formed from conductive silicon carbide (SiC), which may be 4H-SiC. Specifically, 4H-SiC may be used as the SiC material for the substrate 110 because it has less than 1% lattice mismatch with AlN, which is the material of the first layer 130 of the dielectric stack layer 120, so that crystalline AlN can be grown on the substrate 110. The dielectric stack layer 120 is formed by a stack of two layers, including a first layer 130 directly deposited on the substrate 110, and a second layer 140 deposited on the first layer 130. The first layer 130 is formed with AlN epitaxially or as a single crystal layer. The second layer 140 is formed with $Al_2O_3$, which may be polycrystalline or amorphous $Al_2O_3$, and the second layer 140 is not a single crystal layer. In certain embodiments, the second layer 140 is formed as a single crystal layer or an amorphous layer. Specifically, the second layer 140 is provided in order to reduce the leakage current of the capacitor 100 at higher voltages. To finalize the capacitor 100, the Schottky contact layer 150 is deposited on the second layer 140, such that the metal spreads the electric potential but does not conduct electricity into the dielectric stack layer 120. The Ohmic contact layer 160 deposited on the substrate 110, such that the electric potential is spread similarly, but in addition there is a good conduction of electricity into the SiC semiconductor. In certain embodiments, both the Schottky contact layer 150 and the Ohmic contact layer 160 may be formed by nickel (Ni). In one embodiment, the Ohmic contact layer 160 is formed by annealing Ni at a temperature in a range of about 800-1200° C. for about 0.1-5 minutes. In one embodiment, the Ohmic contact layer 160 is formed by annealing Ni at about 1000° C. for about 1 minute.

Figure 1B:
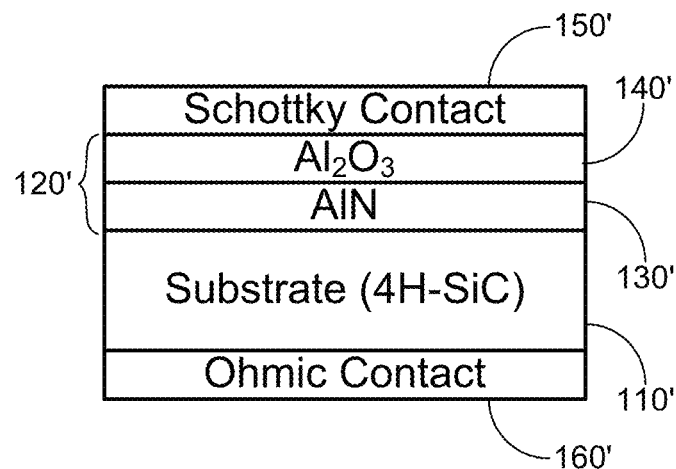
FIG. 1B shows schematically a capacitor according to another embodiment of the invention.

FIG. 1B shows schematically a capacitor according to another embodiment of the invention. Specifically, the capacitor 100' as shown in FIG. 1B and the capacitor 100 as shown in FIG. 1A have different structures. In particular, the major difference between the two structures of the capacitors exists in that, as shown in FIG. 1B, the Ohmic contact layer 160' is deposited on the bottom side of the substrate 110', and the dielectric stack layer 120' (including the first layer 130' formed with AlN, and the second layer 140' formed with $Al_2O_3$) remains being deposited on the top side of the substrate 110'. In other words, in the capacitor 100' as shown in FIG. 1B, the Ohmic contact layer 160' and the dielectric stack layer 120' (including the first layer 130' formed with AlN, and the second layer 140' formed with $Al_2O_3$) are respectively deposited on the two opposite sides of the substrate 110'. In comparison, in the capacitor 100 as shown in FIG. 1A, the Ohmic contact layer 160 and the dielectric stack layer 120 (including the first layer 130 formed with AlN, and the second layer 140 formed with $Al_2O_3$) are deposited on the same top side of the substrate 110, and the area of the substrate 110 must be larger such that both the Ohmic contact layer 160 and the dielectric stack layer 120 may be deposited on the same side of the substrate 110.

In certain embodiments, a thickness of the first layer is in a range of about 100-1500 nm, and a thickness of the second layer is in a range of about 10-250 nm.

In each of the embodiments as described above, the capacitor provides high temperature stability without significant change in capacitance, which is very important for the high temperature and high power applications. For example, in certain embodiments, the capacitor has an operating temperature range between −250° C. and 600° C., where a capacitance change of the capacitor in the operating temperature range is less than 10%.

In certain embodiments, the $Al_2O_3$/AlN/4H-SiC material stack is used as the capacitor material that operates with very little loss of functionality from cryogenic temperatures to nearly 350° C. (demonstrated) with the potential to operate up to 600° C. (predicted). Specifically, the dielectric stack layer includes the first layer, which is a thin layer of aluminum nitride (AlN) grown epitaxially (or as a single crystal layer) on the top side of the SiC substrate, and a second layer, which is an $Al_2O_3$ layer grown on the top of the first layer, and is not a single crystal layer. In addition to this dielectric stack of materials, two metal layers are adapted for electrical contact. The Schottky contact layer is a metal layer deposited on the top of the second layer ($Al_2O_3$), such that the metal spreads the electric potential but does not conduct electricity into the dielectric stack layer. The Ohmic contact layer is another metal layer formed on the SiC substrate, such that the electric potential is spread similarly, but in addition there is a good conduction of electricity into the SiC semiconductor.

The main advantage of the structure of the capacitor exists in the ultrastable properties of the resulting electronic device over such a large range of temperatures as well as such extremely high temperatures. Currently available capacitors have wide swings in value as the temperature changes through various ranges up to approximately 200° C. at a maximum. This can be destabilizing to an electrical system which may operate at such high temperatures such as car engines or next generation power systems, for example. Additionally, creating an electronic component such as a capacitor which is small and can operate at high temperatures reduces the size and weight of future transportation based power systems, thus increasing efficiency and reducing cost due to reducing the requirement for bulky and expensive cooling systems.

Figure 1C:
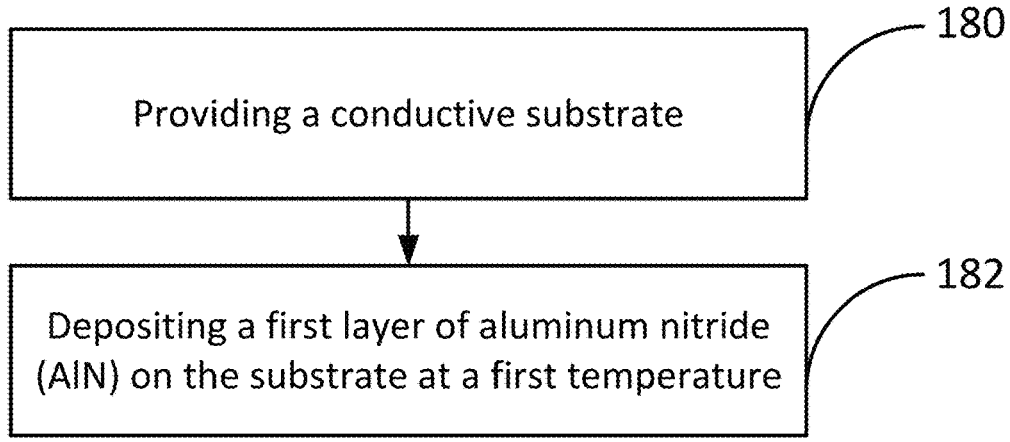
FIG. 1C shows a flowchart for a method of forming a capacitor according to one embodiment of the invention.

FIG. 1C shows a flowchart for a method of forming a capacitor according to certain embodiments of the invention. Specifically, at procedure 180, a conductive substrate is provided. The conductive substrate may be formed with a conductive SiC material, such as 4H-SiC. At procedure 182, a first layer is deposited on the conductive substrate by forming AlN epitaxially or as a single crystal layer at a first temperature. In one embodiment, the first layer is deposited by molecular beam epitaxy (MBE), hydride vapor-phase epitaxial (HVPE), physical vapor transport (PVT), metal organic chemical vapor deposition (MOCVD), or any modification of them. In one embodiment, the first temperature may be in a range of about 700-1100° C., preferably about 800° C.

Figure 1D:
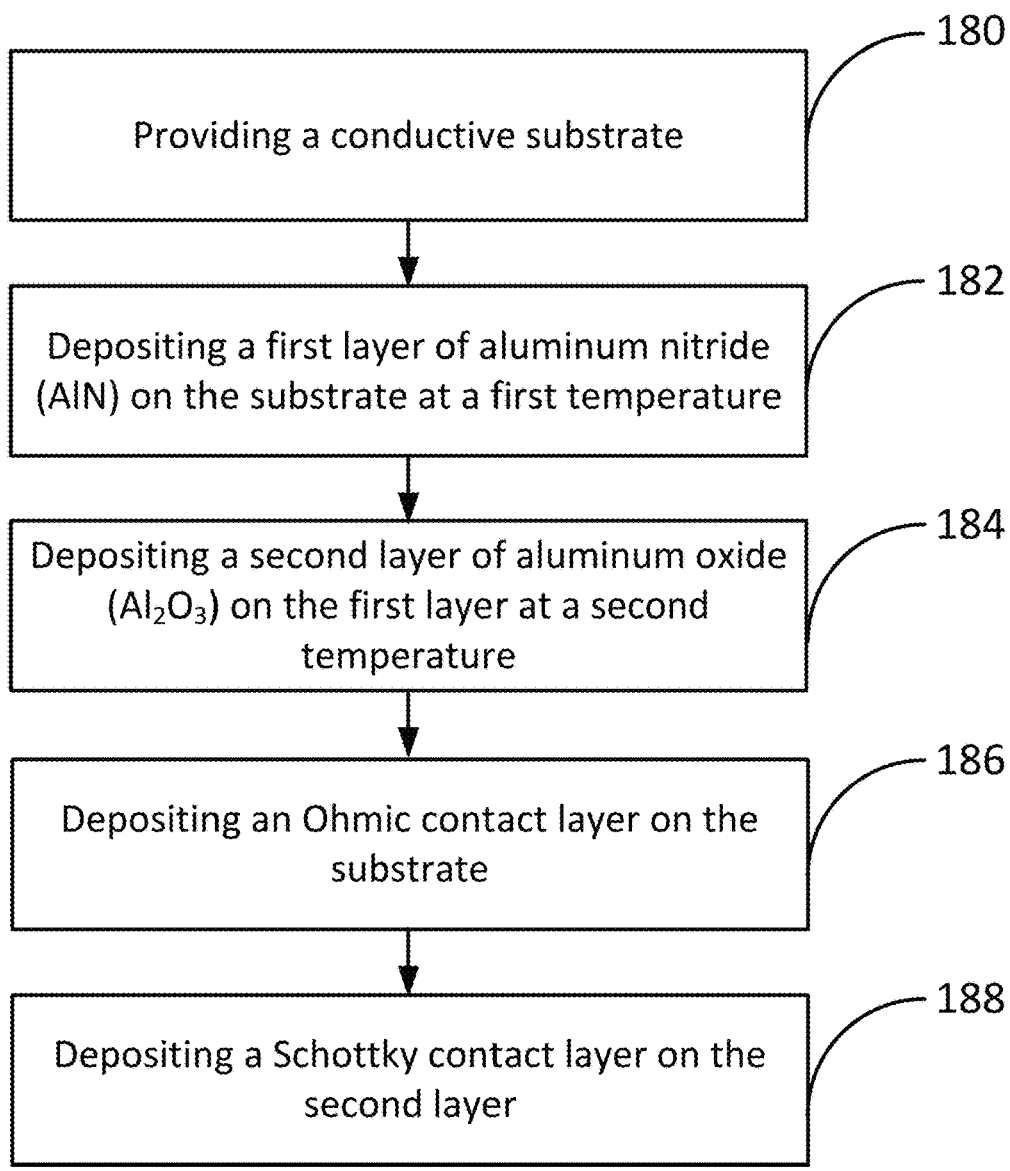
FIG. 1D shows a flowchart for a method of forming a capacitor according to another embodiment of the invention.

FIG. 1D shows a flowchart for a method of forming a capacitor according to another embodiment of the invention. Specifically, the method as described in FIG. 1D may be used to form the capacitor as shown in FIG. 1A or FIG. 1B. It should be particularly noted that the sequence of the procedures as described in the flowchart as shown in FIG. 1D may vary, and is thus not intended to limit the disclosure thereof.

As shown in FIG. 1D, at procedure 180, a substrate is provided. The substrate may be formed with a conductive SiC material, such as 4H-SiC. At procedure 182, a first layer is deposited on the substrate by forming AlN epitaxially or as a single crystal layer at a first temperature. In one embodiment, the first layer is deposited by molecular beam epitaxy (MBE), hydride vapor-phase epitaxial (HVPE), physical vapor transport (PVT), metal organic chemical vapor deposition (MOCVD), or any modification of them. In one embodiment, the first temperature may be in a range of about 700-1100° C., preferably about 800° C. At procedure 184, a second layer is deposited on the first layer by forming $Al_2O_3$ at a second temperature. In one embodiment, the second layer is deposited by atomic layer deposition (ALD), sintering, or any modification of them. In one embodiment, the second temperature may be in a range of about 50-150° C., preferably about 100° C. In this case, the first layer and the second layer form a dielectric stack layer on the substrate. At procedure 186, an Ohmic contact layer is deposited on the substrate. In certain embodiment, the Ohmic contact layer may be formed by annealing a metal (such as Ni) at a third temperature for a time period. In one embodiment, the third temperature may be in a range of about 800-1200° C., preferably about 1000° C., and the time period may be in a range of about 0.1-5 minutes, preferably about 1 minute. At procedure 188, a Schottky contact layer, which may be formed with Ni, is deposited on the second layer.

Various experiments were performed to test certain embodiments of the capacitors and methods of forming the capacitors, and to compare certain embodiments of the capacitors with capacitors without the second layer ($Al_2O_3$) in order to predict the effect of the dielectric stack layer.

Specifically, in one embodiment, material growth was performed using molecular beam epitaxy (MBE) and atomic layer deposition (ALD). 4H-SiC was chosen as the material of the substrate because of its great performance at high temperature. In one embodiment, a first layer of AlN with a thickness of about 1000 nm was grown on the substrate at about 800° C. using MBE, and a second layer of $Al_2O_3$ with a thickness of about 150 nm was deposited on the first layer at about 100° C. using ALD.

Figure 2:
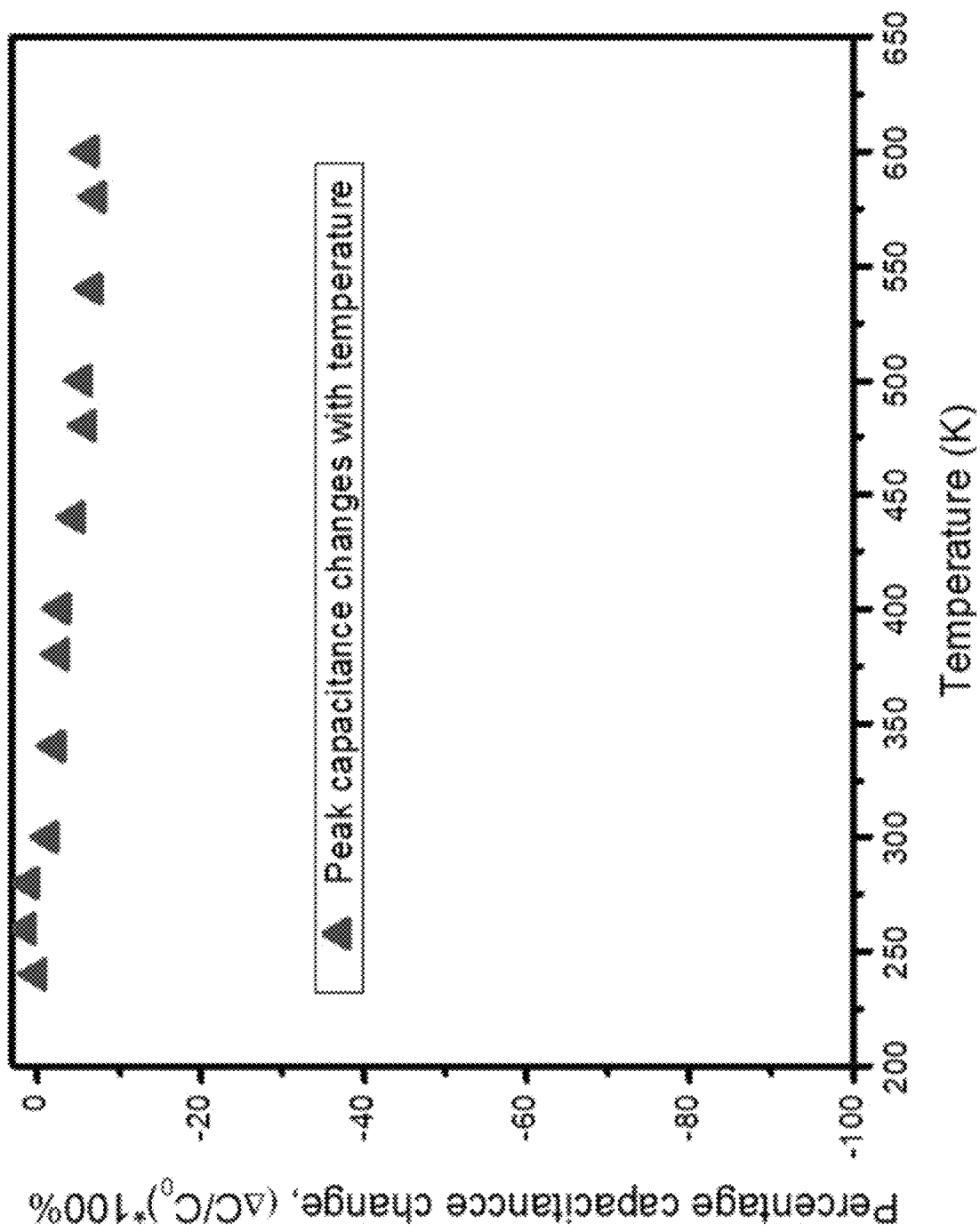
FIG. 2 shows a chart of the capacitance change relative to environmental temperature for the capacitor according to certain embodiments of the invention.

In another embodiment, to demonstrate the initial temperature dependence capacitance performance, a first layer of single crystalline AlN with a thickness of about 300 nm was grown on the substrate at about 800° C. using MBE, and a second layer of $Al_2O_3$ with a thickness of about 150 nm was deposited on the first layer at about 100° C. using ALD. After the dielectric stack layer is formed, a capacitor was made, and the capacitance was measured at different temperatures at about 1 MHz frequency. FIG. 2 shows a chart of the capacitance change relative to the environmental temperature for the capacitor according to certain embodiments of the invention, in which the percentage of the capacitance change relative to the environmental temperature is shown between 240 K (−33° C.) to 600 K (327° C.). As shown in FIG. 2, in the wide range of the environmental temperature between 240 K (−33° C.) to 600 K (327° C.), the capacitance changes by less than about 10%. In comparison, off the shelf high temperature capacitors in some cases may have the capacitance change by about 70%. This level of consistency is very important for high power or high temperature systems.

Figure 3:
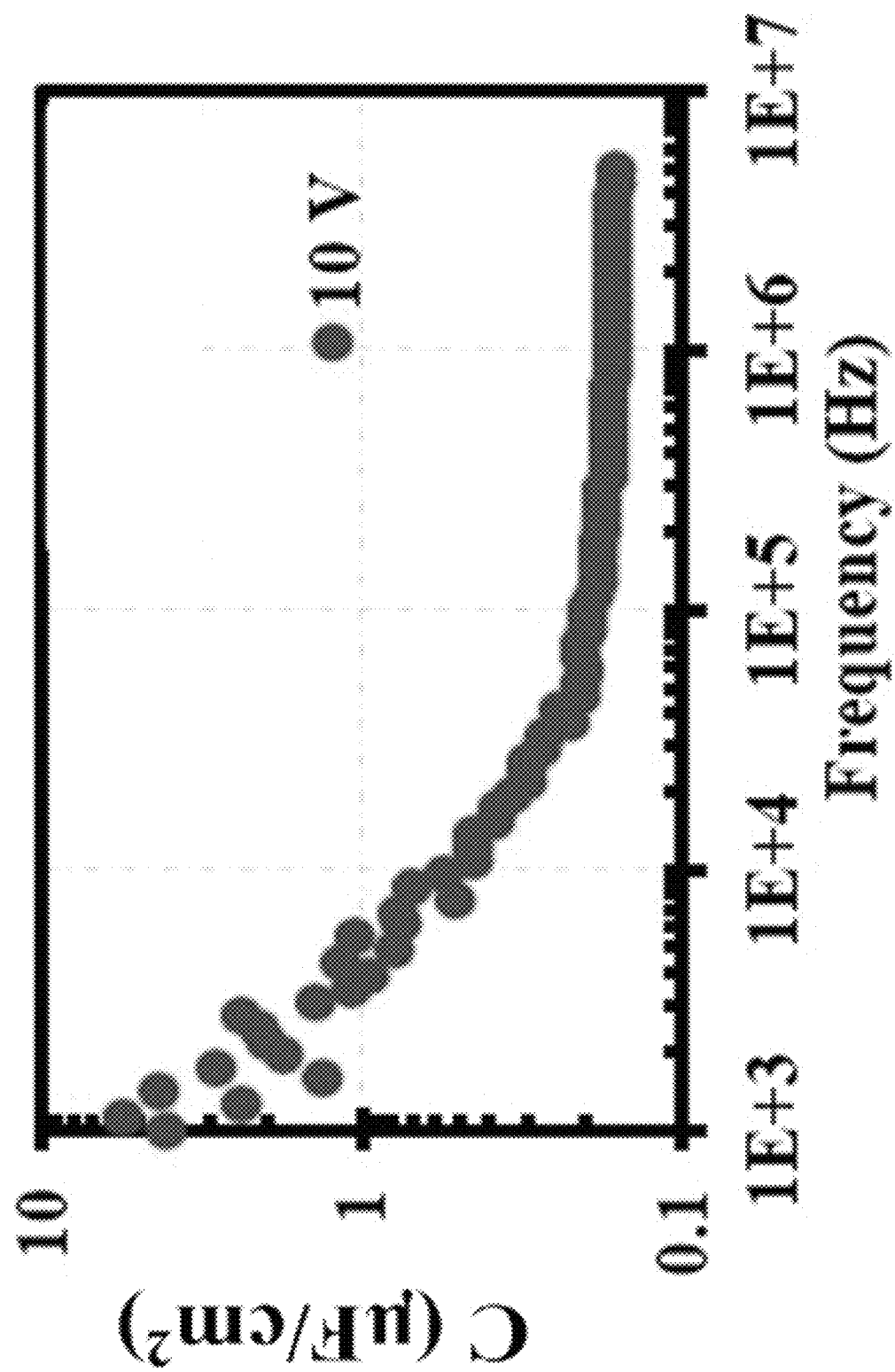
FIG. 3 shows a chart of capacitance density as a function of the frequency for the capacitor according to certain embodiments of the invention.

Another important characteristic of the capacitor according to the embodiments to be observed is the capacitance thereof at the low frequency. Specifically, higher capacitance is observed at the low frequency. FIG. 3 shows a chart of capacitance density as a function of the frequency for the capacitor according to certain embodiments of the invention. As shown in FIG. 3, the capacitance density at about 1 kHz is nearly about 10 $\mu F/cm^2$, which allows for the high capacitance using a very small area and volume.

Figure 4:
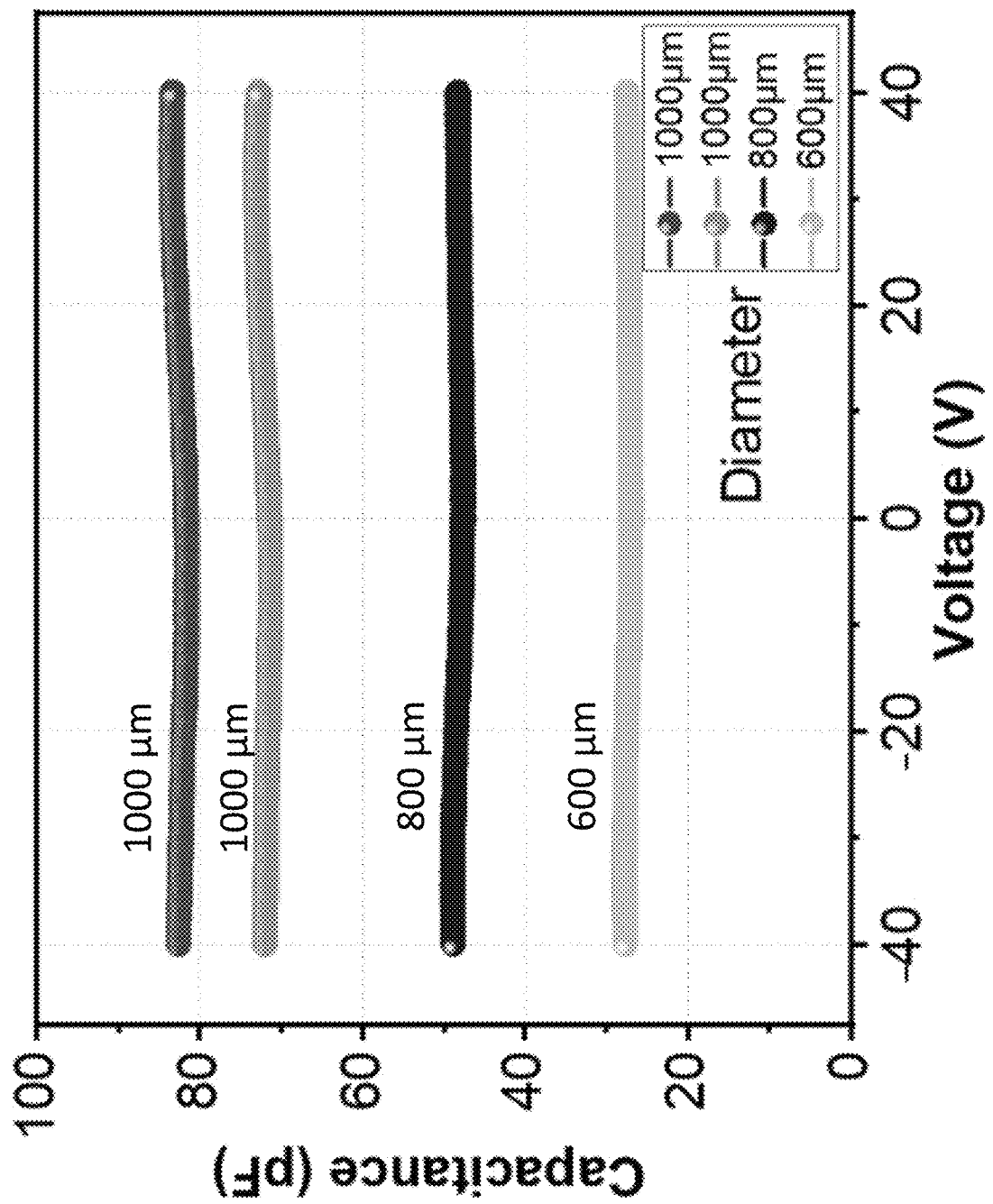
FIG. 4 shows a chart of capacitance-voltage (C-V) characteristics for capacitors having different diameters according to certain embodiments of the invention.
Figure 5:
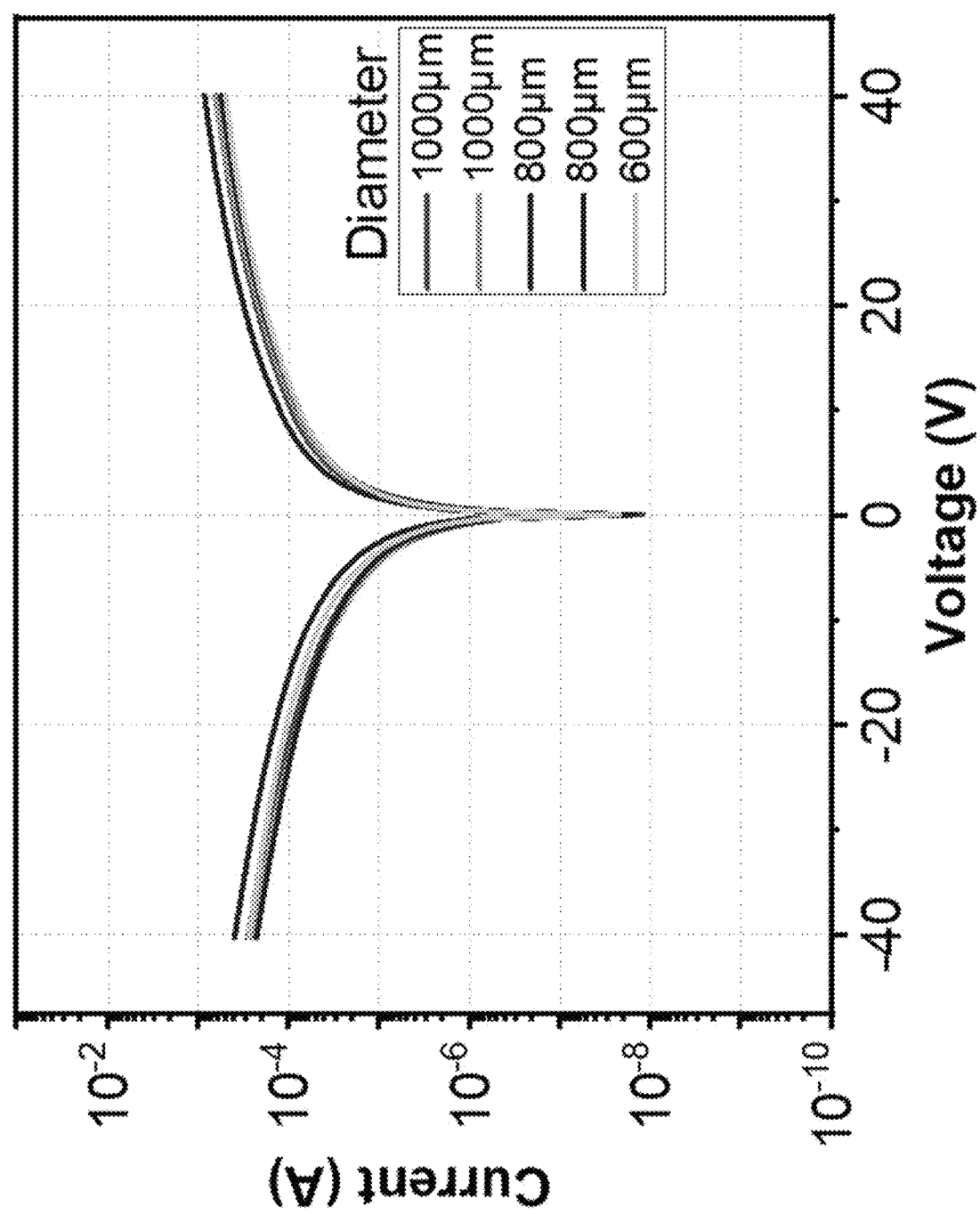
FIG. 5 shows a chart of current-voltage (I-V) characteristics for capacitors having different diameters according to certain embodiments of the invention.

In the embodiments, the second layer of $Al_2O_3$ having a thickness of about 150 nm is grown on the first layer. The purpose of using $Al_2O_3$ as the second layer is to reduce the leakage current and improve the high voltage operation, and the capacitance-voltage characteristics exhibit bipolar operation with voltage stability. To demonstrate this characteristic, FIG. 4 shows the capacitance-voltage (C-V) characteristics for capacitors having different diameters according to certain embodiments of the invention, and FIG. 5 shows the current-voltage (I-V) characteristics for capacitors having different diameters according to certain embodiments of the invention. Specifically, different capacitors having diameters of about 1000, 1000, 800 and 600 $\mu m$ were prepared, and data was measured from about −40 V to about +40 V, which is a limitation of the testing equipment. As shown in FIGS. 4 and 5, the capacitance of each capacitor remains stable throughout the different voltages, and there is no significant change of current, showing the voltage stability.

Figure 6:
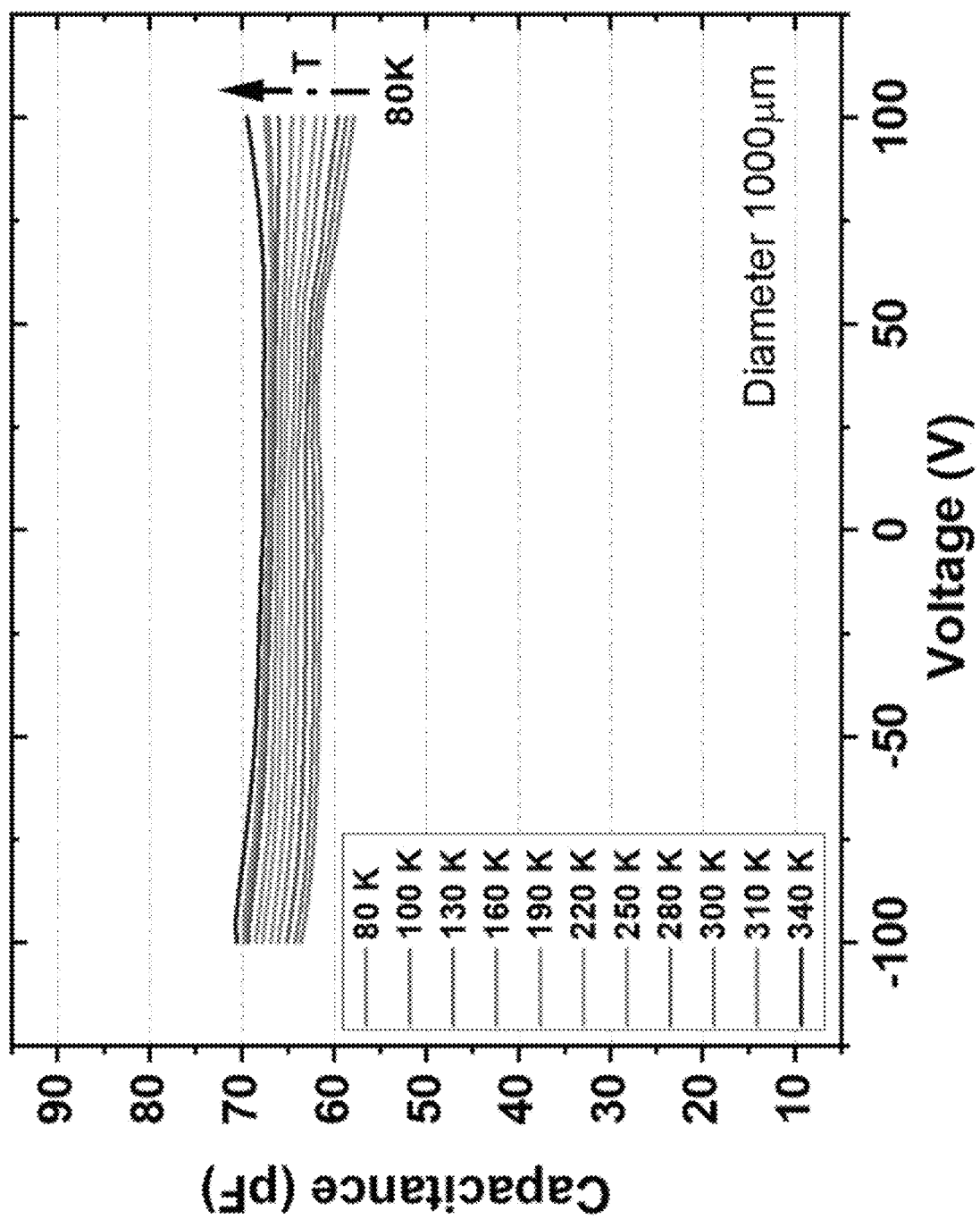
FIG. 6 shows a chart of capacitance-voltage (C-V) characteristics for a capacitor operating at different temperatures according to certain embodiments of the invention.
Figure 7:
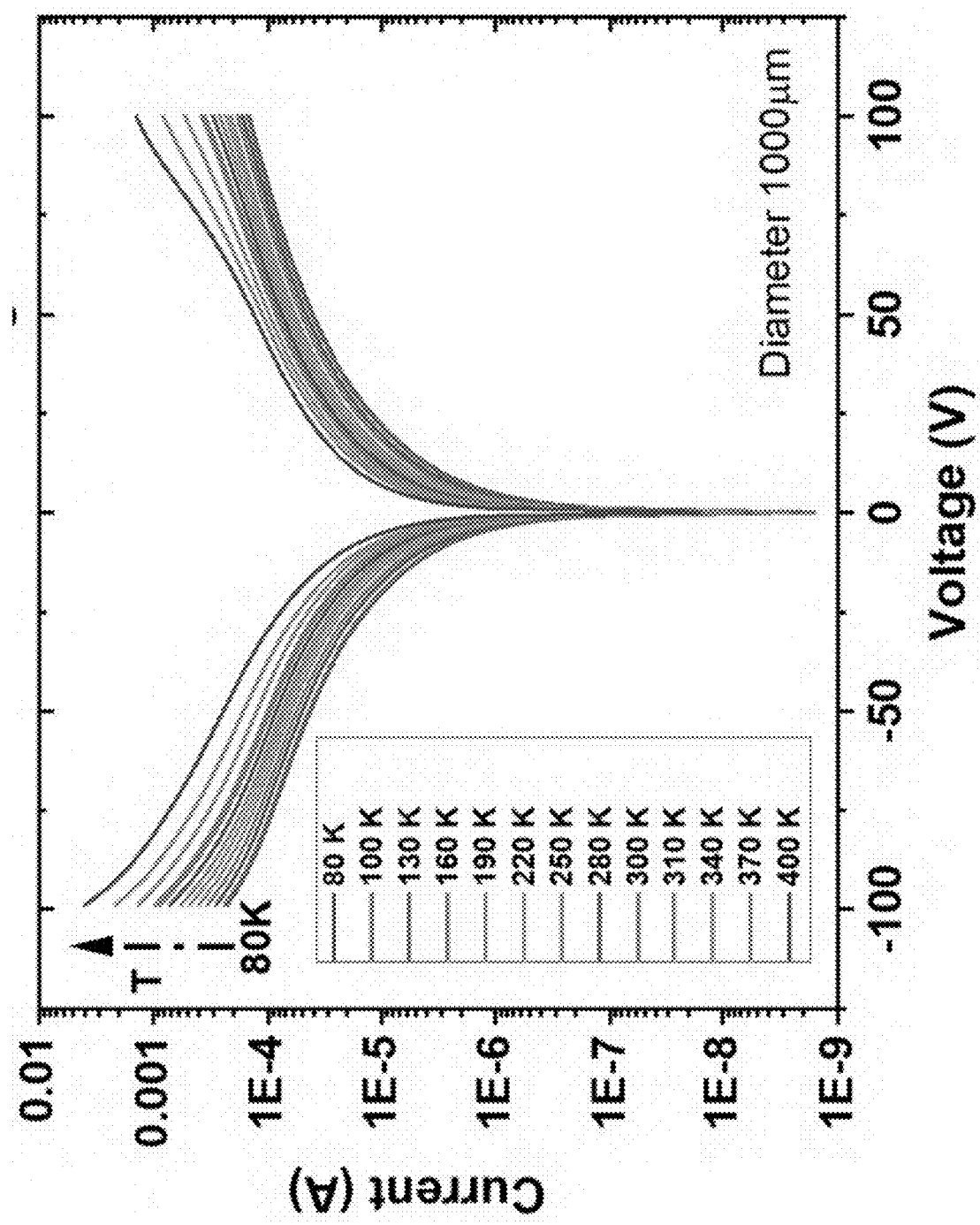
FIG. 7 shows a chart of current-voltage (I-V) characteristics for a capacitor operating at different temperatures according to certain embodiments of the invention.

FIGS. 6 and 7 show respectively the C-V and I-V characteristics of a 1000 $\mu m$ diameter capacitor with the operating temperature changed from about 80 K (−193.1° C.) to about 400 K (126.85° C.), where data was measured from about −100 V to about +100 V. It is clearly shown that the capacitor remains stable throughout the different voltages in the operating temperature range and the capacitance change in the operating temperature range is less than about 10%.

In addition, experiments for comparison between capacitors with or without the $Al_2O_3$ have been performed to show the effect of $Al_2O_3$ as the second layer. In one embodiment, in both capacitors with or without the $Al_2O_3$, the thickness of the first layer of AlN is about 1000 nm (1 $\mu m$), and the diameter of each capacitor is about 1000 $\mu m$ (1 mm). In the capacitor with the $Al_2O_3$, the thickness of the second layer of $Al_2O_3$ is about 150 nm (0.15 $\mu m$). The experiment gives the leakage current information for the capacitors. Ideal capacitors are insulators, so lower leakage current is better. The purpose is to reduce the leakage current further so that larger capacitance can be obtained using larger area devices, with higher voltage being possible.

Figure 8:
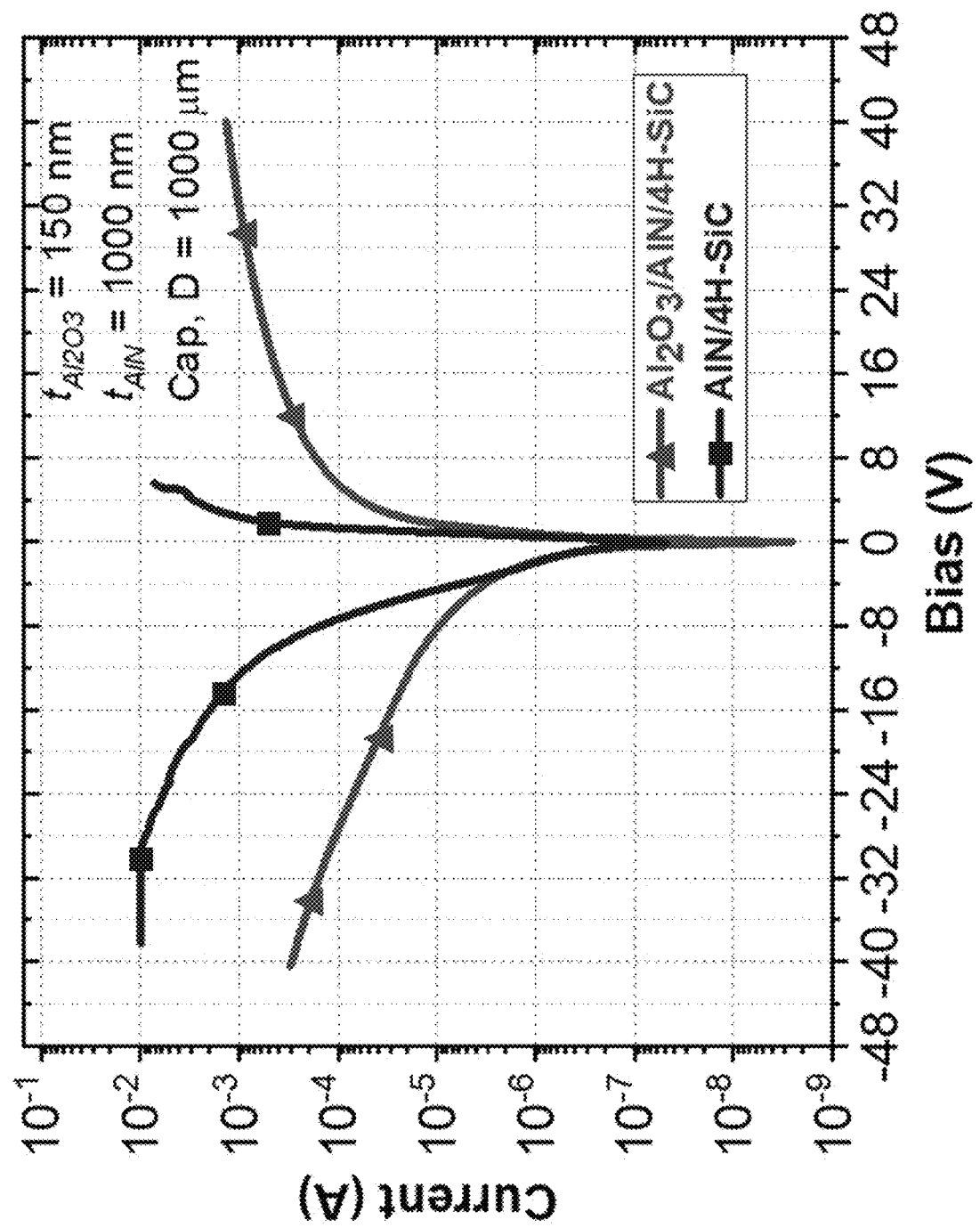
FIG. 8 shows a chart of leakage current data for capacitors with or without the $Al_2O_3$ layer according to certain embodiments of the invention.

FIG. 8 shows a chart of leakage current data for capacitors with or without the $Al_2O_3$ layer according to certain embodiments of the invention. As shown in FIG. 8, it is apparent that the second layer formed with $Al_2O_3$ helps to improve the leakage current, i.e., reduce it over the entire voltage range.

Figure 9:
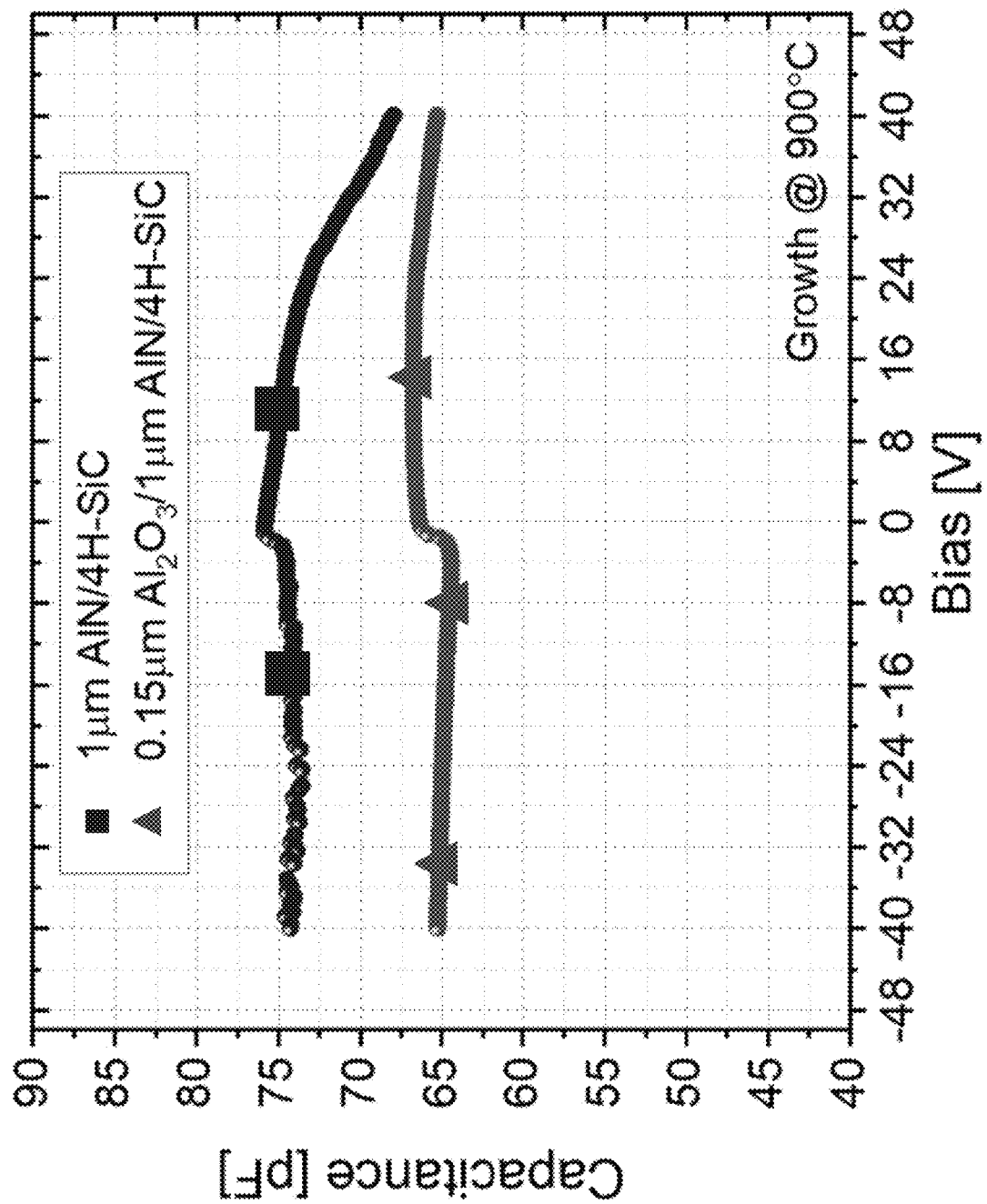
FIG. 9 shows a chart of C-V data for capacitors with or without the $Al_2O_3$ layer according to certain embodiments of the invention.

FIG. 9 shows a chart of C-V data for capacitors with or without the $Al_2O_3$ layer according to certain embodiments of the invention. Specifically, the data was taken at about 1 MHz and room temperature. As shown in FIG. 9, for the capacitor with no $Al_2O_3$ layer, the capacitance is larger than that for the capacitor with the $Al_2O_3$ layer, which is expected due to the increased overall thickness of the total dielectric stack layer. Additionally, the capacitor without the $Al_2O_3$ layer exhibits a decay in forward bias, which is generally understood to be a direct result of the increased leakage current in forward bias. This decay in forward bias is almost completely absent in the capacitor with the additional $Al_2O_3$ layer.

Figure 10:
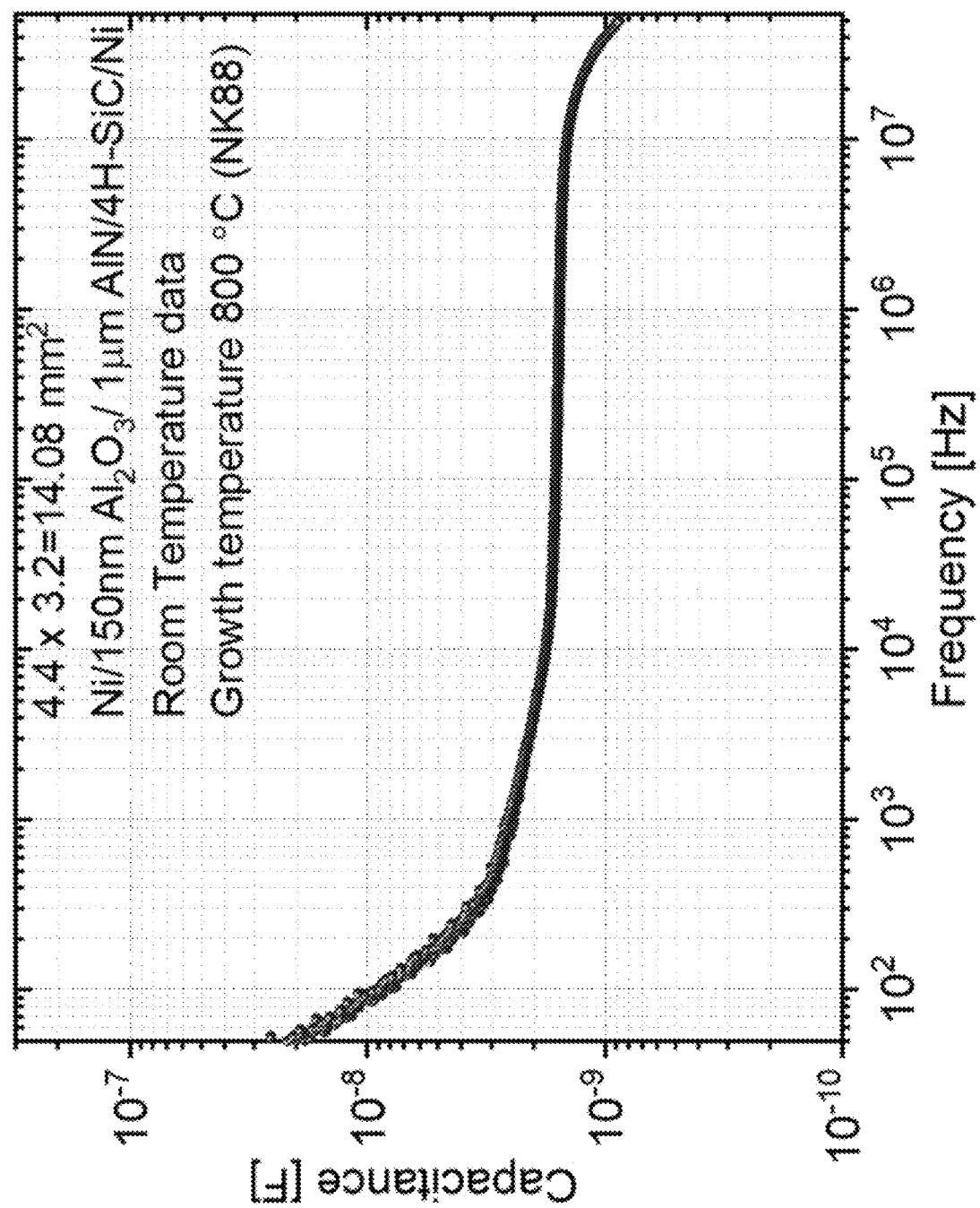
FIG. 10 shows a chart of capacitance versus frequency data for a capacitor having an area of about 14 $mm^2$ according to certain embodiments of the invention.

In the experiments as described above, the capacitors being made are relatively small area capacitors. However, larger area capacitors can also be made to obtain higher capacitance value, increasing 1000× from the pF range to the nF range. FIG. 10 shows a chart of capacitance versus frequency data for a capacitor having an area of about 14 $mm^2$ according to certain embodiments of the invention. Specifically, for the capacitor being made, the final area of the diced and processed capacitor was about 14.08 $mm^2$ (=4.4×3.2). The thickness of the first layer of AlN is about 1000 nm (1 $\mu m$), and the thickness of the second layer of $Al_2O_3$ is about 150 nm (0.15 $\mu m$). The data was taken at room temperature. As shown in FIG. 10, the data shows that at the frequency of about 53 Hz, the capacitance is about 25.6 nF, and at the frequency of about 50 MHz, the capacitance is about 0.88 nF. Additionally, the capacitance is extremely stable when the frequency is in the range from about 1 kHz to about 10 MHz.

In certain embodiments, the capacitor has the advantage of low capacitance change over the temperature range between about −200° C. and about 400° C. and mid-high voltage application. The capacitor according to certain embodiments of the invention may be used as thin film capacitors with small volume, which can work without any costly and complicated cooling systems. Further, the capacitor according to certain embodiments of the invention may be used to help increase power density and reduce EMI and parasitic inductance and resistance.

The capacitor according to certain embodiments of the invention may be used as a high temperature capacitor, such as Class I (commercial NP0/C0G high temperature dielectric ceramic capacitor, about −55° C. to about 200° C.) or Class II (X7R, X8R, X7S, X7U dielectric, about −55° C. to about 125° C.).

In certain embodiments, the capacitor may be used in any electronic device that operates in high temperature environment. Examples of the electronic devices include, without being limited thereto, high power and high temperature electronics, such as inverters, converters, or embedded high power electronics. These electronic devices may be used for space exploration, down hole exploration, harsh environment, avionics, etc.

In the next generation electric vehicles, power control systems will depend significantly on wide-band gap materials, such as SiC and GaN to reduce cost and increase capacity. These materials will help increase the power conversion efficiency, switching frequencies, and power density, as well as support high temperature operation in traction drive systems, for example. WBG power electronics will significantly increase the driving range and reduce the cost of electric vehicles. Future generations of high-power electronic converters will rely on the flexibility and tolerance of components used to increase power density in order to supply a greater power in a smaller form. With the development of high temperature capacitors, which can operate at extremely high temperatures (about 600° C.) without any cooling system, the deficiencies of traditional capacitor failure at the high temperature environments may be solved. The invention provides thin film capacitors that can work from cryogenic to extremely high temperature (about 600° C.) with negligible changes in capacitance and without using any extra cooling system, which will help increase the power density for next generation power systems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

LIST OF REFERENCES

[1]. Khosa R Y, Chen J T, Palsson K, Karhu R, Hassan J, Rorsman N, Sveinbjörnsson E Ö, Electrical properties of 4H-SiC MIS capacitors with AlN gate dielectric grown by MOCVD. Solid-State Electronics, 153:52-58. (2019) https://doi.org/10.1016/j.sse.2018.12.016

[2]. Sergeeva O N, Bogomolov A A, Solnyshkin A V, Komarov N V, Kukushkin S A, Krasovitsky D M, Dudin A L, Kiselev D A, Ksenich S V, Senkevich S V, Kaptelov E Y, Pronin I P, SEM, Dielectric, Pyroelectric, and Piezoelectric Response of Thin Epitaxial AlN Films Grown on SiC/Si Substrate. Ferroelectrics, 477(1):121-130. (2015) https://doi.org/10.1080/00150193.2015.1000144

What is claimed is:

1. A capacitor, comprising:
a conductive substrate formed with a silicon carbide (SiC) material, wherein the SiC material of the substrate is 4H-SiC;
a dielectric stack layer, comprising a first layer deposited directly on the substrate, wherein the first layer is formed of aluminum nitride (AlN) grown epitaxially on the substrate as a single crystal layer, and a second layer comprising aluminum oxide ($Al_2O_3$) grown directly on the first layer; and
a Schottky contact layer deposited directly on the second layer.

2. The capacitor according to claim 1, further comprising an Ohmic contact layer deposited on the substrate.

3. The capacitor according to claim 2, wherein the Ohmic contact layer and the dielectric stack layer are deposited on a same side of the substrate.

4. The capacitor according to claim 2, wherein the Ohmic contact layer and the dielectric stack layer are deposited respectively on two opposite sides of the substrate.

5. The capacitor according to claim 2, wherein the Ohmic contact layer is formed with nickel (Ni).

6. The capacitor according to claim 1, wherein the Schottky contact layer is formed with nickel (Ni).

7. The capacitor according to claim 1, having an operating temperature range between −250° C. and +600° C., wherein a capacitance change of the capacitor in the operating temperature range is less than 10%.

8. The capacitor according to claim 1, wherein a thickness of the first layer is in a range of about 100-1500 nm, and a thickness of the second layer is in a range of about 10-250 nm.

9. An electronic device comprising at least one capacitor according to claim 1.

* * * * *